(12) United States Patent
Liu (10) Patent No.: US 7,622,996 B2
(45) Date of Patent: Nov. 24, 2009

(54) MULTI-LOOP PHASE LOCKED LOOP CIRCUIT

(75) Inventor: Ren-Chieh Liu, Chang-Hua Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 100 days.

(21) Appl. No.: 11/845,729

(22) Filed: Aug. 27, 2007

(65) Prior Publication Data

US 2008/0061888 A1  Mar. 13, 2008

(30) Foreign Application Priority Data

Sep. 7, 2006  (TW) .............................. 95133061 A (51) Int. Cl.
*H03L 7/00* (2006.01)
(52) U.S. Cl. ...................... 331/11; 331/10; 331/16; 331/60
(58) Field of Classification Search .............. 331/10, 331/11, 16, 60
See application file for complete search history.

(56) References Cited

U.S. PATENT DOCUMENTS 5,790,942 A * 8/1998 Le Corre et al. ............ 455/112
7,061,330 B2 * 6/2006 Kegasa et al. ............... 331/11
2002/0136342 A1 * 9/2002 Lee et al. ..................... 375/376
2007/0035348 A1 * 2/2007 Self ............................. 331/16

OTHER PUBLICATIONS

Geum-Young Tak, et al., "A 6.3-9-Ghz CMOS Fast Settling PLL for MB-OFDM UWB Applications", IEEE Journal of Solid-State Circuits, vol. 40, No. 8, Aug. 2005, pp. 1671-1679.

* cited by examiner

*Primary Examiner*—Joseph Chang
*Assistant Examiner*—Jeffrey Shin
(74) *Attorney, Agent, or Firm*—Winston Hsu (57) ABSTRACT

Disclosed is a multi-loop PLL circuit and a related method of which, the circuit includes: a first loop for generating a first control current; a second loop for generating a second control current; a loop filter for generating a control signal according to the first control current or the second control current; a voltage control oscillator for generating a first oscillating signal or a second oscillating signal according to the control signal; a first frequency divider for generating a first feed back clock signal; a second frequency divider for generating a second feed back clock signal; and a control circuit for switching the first loop or the second loop to generate the control signal. The frequency of the second reference clock signal is higher than which of the first reference clock signal. The control circuit turns on the second loop first and then turns on the first loop.

27 Claims, 6 Drawing Sheets

MULTI-LOOP PHASE LOCKED LOOP CIRCUIT

BACKGROUND OF THE INVENTION

1. Field of the Invention

The present invention relates to a phase locked loop circuit, and particularly relates to a multi-loop phase locked loop circuit.

2. Description of the Prior Art

Figure 1:
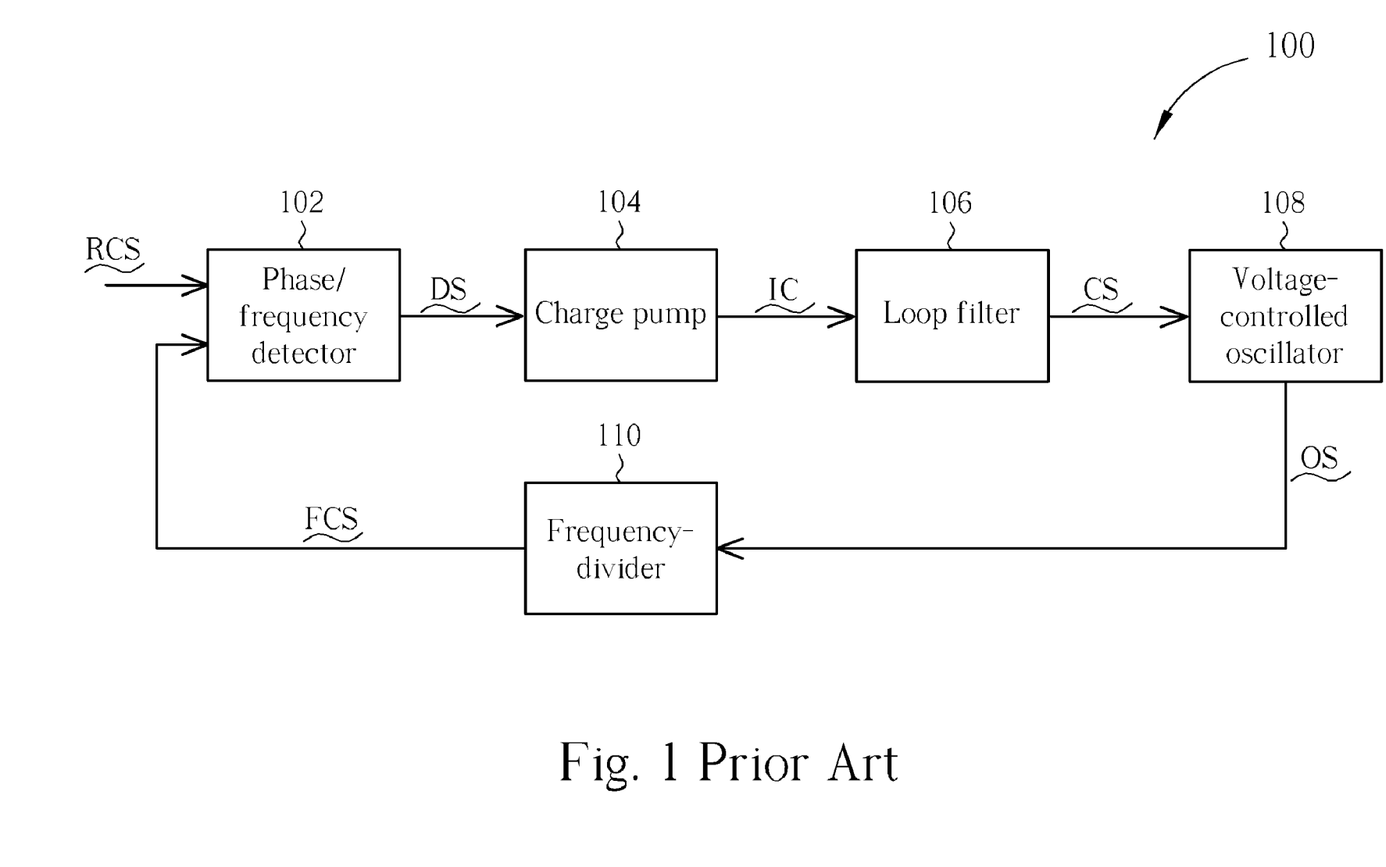
FIG. 1 illustrates a prior art PLL circuit.

In circuit fields, a phase locked loop circuit is used for providing different frequencies to different signals. Please refer to FIG. 1. FIG. 1 is a block diagram illustrating a prior art PLL (phase locked loop) circuit 100. The PLL 100 comprises a phase/frequency detector 102, a charge pump 104, a loop filter 106 and a voltage-controlled oscillator 108. The phase/frequency detector 102 is used for comparing the difference between a reference clock signal RCS and a feed back clock signal FCS and generates a difference signal DS accordingly, wherein the value of the difference signal DS is directly proportional to the phase/frequency difference between the reference clock signal RCS and the feed back clock signal FCS. The charge pump 104 generates a control current Ic to the loop filter 106 according to the difference signal DS. The charge pump 104 provides a current $I_{source}$ to the loop filter 106 if the difference signal DS is UP and the charge pump 104 sinks a current $I_{sink}$ from the loop filter 106 if the difference signal DS is DOWN, wherein the $I_{source}$ is equal to $I_{sink}$. The loop filter 106 suppresses the high frequency component of the control current Ic and outputs a control signal CS for controlling the voltage-controlled oscillator 108. The output of the voltage-controlled oscillator 108 is utilized as an oscillating signal OS and is frequency-divided by the frequency-divider 110 to form a feed-back clock signal FCS. In this way, the oscillating signal OS will be gradually locked to the reference clock signal RCS.

The processing speed of the electronic apparatus increases as technology improves, however. The speed of the above-mentioned prior art PLL is limited, such that the demand of high frequency jumping system such as UWB (Ultra Wideband) cannot be met. Therefore, a PLL with faster convergence speed is needed.

SUMMARY OF THE INVENTION

One objective of the present invention is to provide a new PLL, which initially locks a PLL rapidly by utilizing a high frequency reference clock signal and then switches the PLL to a reference clock signal with low frequency to gradually lock the PLL, such that the locking time of the PLL can be decreased.

One embodiment of the present invention discloses a multi-loop phase locked loop apparatus, which comprises a first loop, a second loop, a loop filter, a voltage control oscillator, a first frequency divider, a second frequency divider and a control circuit. The first loop comprises: a first phase/frequency detector, for detecting the difference between a first feedback clock signal and a first reference clock signal to output a first difference signal; and a first charge pump, coupled to the first phase/frequency detector, for generating a first control current according to the first difference signal.

The second loop comprises: a second phase/frequency detector, for detecting the difference between a second feedback clock signal and a second reference clock signal to output a second difference signal; and a second charge pump, coupled to the second phase/frequency detector, for generating a second control current according to the second difference signal. The loop filter, which is coupled to the first charge pump and the second charge pump, is used for generating a control signal. The voltage control oscillator, which is coupled to the loop filter, is used for generating an oscillating signal according to the control signal. The first frequency divider, which is coupled to the voltage control oscillator and the first phase/frequency detector, is used for frequency-dividing the oscillating signal to generate the first feedback clock signal. The second frequency divider, which is coupled to the voltage control oscillator and the second phase/frequency detector, is used for frequency-dividing the oscillating signal to generate the second feedback clock signal. The control circuit, which is coupled to the first loop and the second loop, is used for switching the first loop or the second loop to generate the control signal according to the first control current, the second control current or the control signal.

Another embodiment of the present invention discloses a phase locking method, which comprises: detecting the difference between a first feedback clock signal and a first reference clock signal to output a first difference signal; generating a first control current according to the first difference signal; detecting the difference between a second feedback clock signal and a second reference clock signal to output a second difference signal; generating a second control current according to the second difference signal; generating a control signal according to at least one of the first control current and the second control current; generating a first oscillating signal according to the control signal; frequency-dividing the first oscillating signal to generate the first feedback clock signal; and frequency-dividing the second oscillating signal to generate the second feedback clock signal.

Another embodiment of the present invention discloses a multi-loop phase locked loop apparatus, which comprises: a feedback clock signal generating module, for generating a first feedback clock signal and a second feedback clock signal; a first loop, for detecting the difference between the first feedback clock signal and a first reference clock to generate a first loop signal; a second loop, for detecting the difference between the second feedback clock signal and a second reference clock to generate a second loop signal; and a control unit, for choosing one of the first loop signal and the second loop signal to be the feedback clock signal, wherein the feedback clock signal generating module generates the first feedback clock signal and the second feedback clock signal according to the feedback clock signal generating module.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . ..". Also, the term "couple" is intended to mean either an indirect or direct electrical connection. Accordingly, if one device is coupled to another device, that connection may be through a direct electrical connection, or through an indirect electrical connection via other devices and connections.

It should be noted that the embodiment according to the present invention described below can be used in UWB, but this is not meant to limit the scope of the present invention. As known by persons skilled in the art, the present invention can be applied to any system requiring high speed frequency changing or high convergence speed when the frequency is switched.

Figure 2:
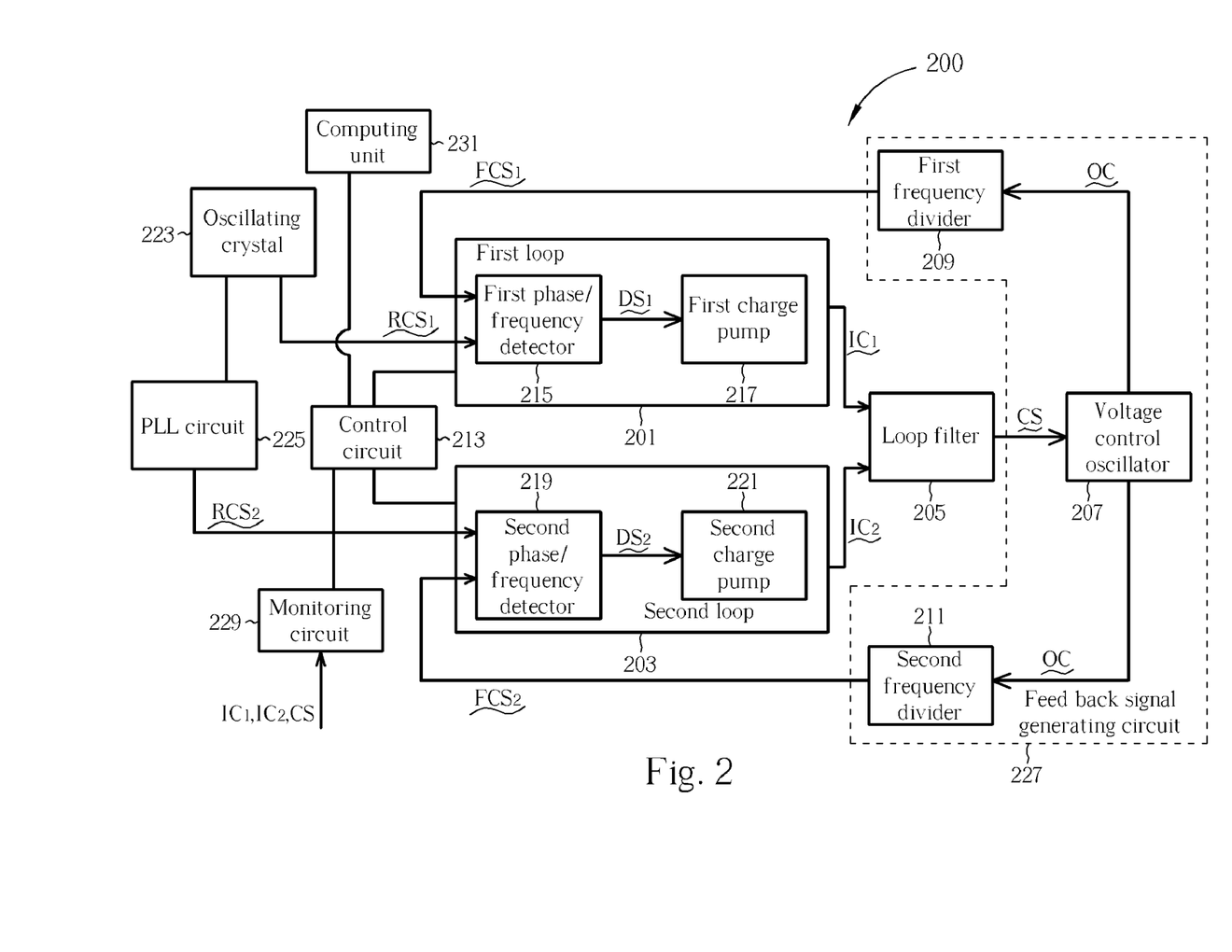
FIG. 2 illustrates a multi-loop PLL apparatus according to a first embodiment of the present invention.

FIG. 2 illustrates a multi-loop PLL apparatus 200 according to a first embodiment of the present invention. As shown in FIG. 2, the multi-loop PLL apparatus 200 includes a first loop 201, a second loop 203, a loop filter 205, a voltage control oscillator 207, a first frequency divider 209, a second frequency divider 211 and a control circuit 213. The first loop 201 includes a first phase/frequency detector 215 and a first charge pump 217. The second loop 203 includes a second phase/frequency detector 219 and a second charge pump 221. The first phase/frequency detector 215 is used for detecting the difference between a first feedback clock signal $FCS_1$ and a first reference clock signal $RCS_1$ to output a first difference signal $DS_1$. The first charge pump 217, which is coupled to the first phase/frequency detector 215, is used for generating a first control current $IC_1$ according to the first difference signal $DS_1$. The second phase/frequency detector 219 is used for detecting the difference between a second feedback clock signal $FCS_2$ and a second reference clock signal $RCS_2$ to output a second difference signal $DS_2$. The second charge pump 221, which is coupled to the second phase/frequency detector 219, is used for generating a second control current $IC_2$ according to the second difference signal $DS_2$. The loop filter 205, which is coupled to the first charge pump 217 and the second charge pump 221, is used for generating a control signal CS according to at least one of the first control current $IC_1$ and the second control current $IC_2$.

The voltage control oscillator 207, which is coupled to the loop filter 205, is used for generating an oscillating signal OS according to the control signal CS. The first frequency divider 209, which is coupled to the voltage control oscillator 207 and the first phase/frequency detector 215, is used for frequency-dividing the oscillating signal OS to generate the first feedback clock signal $FCS_1$. The second frequency divider 211, which is coupled to the voltage control oscillator 207 and the second phase/frequency detector 219, is used for frequency-dividing the oscillating signal OS to generate the second feedback clock signal $FCS_2$. The frequency ratio between the first frequency divider 209 and the second frequency divider 211 can be determined according to the relation between the oscillating signal OS, the first reference clock signal $RCS_1$ and the second reference clock signal $RCS_2$. The control circuit 213, which is coupled to the first loop 201 and the second loop 203, is used for turning on or off the first loop 201 or the second loop 203. In this case, the frequency of the second reference clock signal $RCS_2$ is higher than that of the first reference clock signal $RCS_1$. The control circuit 213 turns off the second loop 203 and turns on the first loop 201 after the multi-loop PLL apparatus 200 is locked to the second reference clock signal $RCS_2$.

In this case, the frequency of the second reference clock signal $RCS_2$ is at least triple that of the first reference clock signal $RCS_1$. Also, the first reference clock signal $RCS_1$ can be generated from an oscillating crystal 223 and be transferred to the second reference clock signal $RCS_2$ with higher frequency via a PLL circuit 225, but this is not a limitation of the present invention. In one circuit, if the initial value of the memory device is a stable solution, the stable state can be reached without convergence time. Therefore, as long as the first loop and the second loop utilize the same loop filter 205 and the voltage control oscillator 207, the stable state can remain, even if the frequency of reference signals $RCS_1$, $RCS_2$, the control current Ic and the frequency dividing ratio of the first frequency divider 205 and the second frequency divider 207 become variant. Thus, according to the above-mentioned embodiments, the multi-loop PLL apparatus 200 can have a stable performance by locking the multi-loop PLL apparatus 200 via the second reference clock signal $RCS_2$ with higher frequency and then switching to the first reference clock signal $RCS_1$ with lower frequency. That is, roughly adjustment and then fine-tuning until gradually locking frequency can be implemented by utilizing loops with different reference frequencies, but the scope of the present invention is not limited to this embodiment.

In this embodiment, a monitoring circuit 229 can be further included for monitoring the value of the first control current $IC_1$ and the second control current $IC_2$, or monitoring whether the control signal is stable, to control the control circuit 213 accordingly. Therefore, the monitoring circuit 229 controls the control circuit 213 to switch to the first loop 201 or the second loop 203 if the first control current $IC_1$ and the second control current $IC_2$ reach a predetermined value. Furthermore, the monitoring circuit 229 can switch to the first loop 201 or the second loop 203 according to whether the control signal CS is stable or not. For example, the multi-loop PLL apparatus 200 initially utilizes the second loop 203 and the second reference clock signal $RCS_2$ with higher frequency to generate the control signal CS, and the monitoring circuit 229 controls the control circuit to switch the second loop 203 to the first loop 201 after monitoring that the control signal CS is stable, to generate the control signal CS by utilizing the first reference clock signal $RCS_1$ with lower frequency. Furthermore, the multi-loop PLL apparatus 200 can further includes a computing unit 231, for counting the time period from the initial oscillating of the system to the switching of the loop, and control the control circuit 213 to switch loops according to this time period counted. In another embodiment, the time needed for the loop with higher frequency to generate the control signal with stable state can be pre-estimated, and the original loop is switched to another loop when the time reaches the pre-estimated time. The computing unit 231 can be implemented by a timer or a counter. The control circuit 213 can be a logic circuit such as an AND gate or a switch.

The voltage control oscillator 207, a feed back signal generating module 227 includes the first frequency divider 209 and the second frequency divider 211 to generate a first feed back signal $FCS_1$ and the second feed back signal $FCS_2$ to the first loop 201 and the second loop 203 respectively, where the first feed back signal $FCS_1$ and the second feed back signal $FCS_2$ are compared with the first and second reference signals $RCS_1$ and $RCS_2$. Therefore, the present invention can be presented as the multi-loop PLL apparatus 300 shown in FIG. 3 or the multi-loop PLL apparatus 400 shown in FIG. 4.

Figure 3:
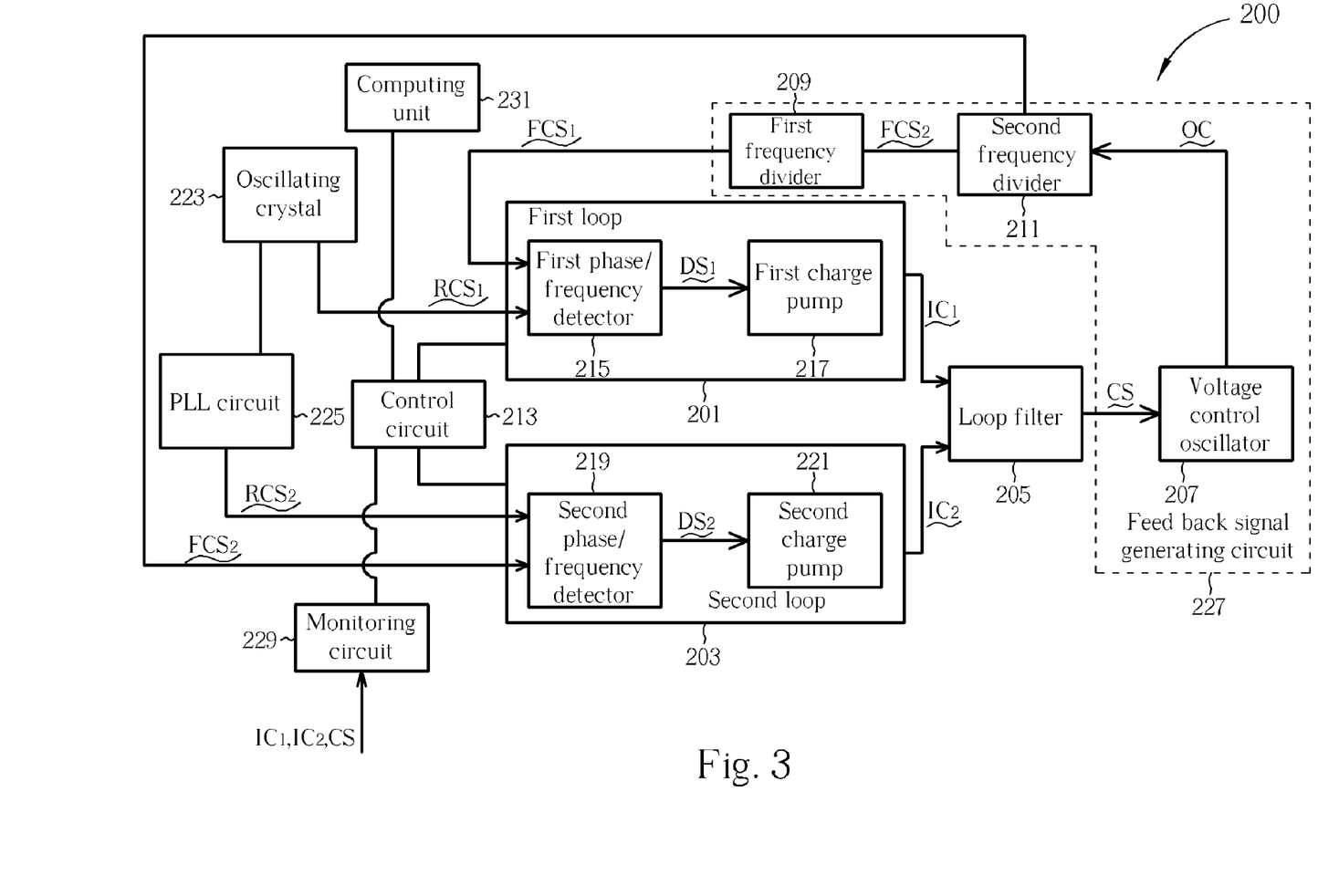
FIG. 3 illustrates a multi-loop PLL apparatus according to a second embodiment of the present invention.

As shown in FIG. 3, the feed back signal generating module 227 also includes the voltage control oscillator 207, the first frequency divider 209 and the second frequency divider 211, and the first frequency divider 209 and the second frequency divider 211 are coupled in series. The second frequency divider 211 is coupled between the first frequency divider 209, the second loop 203 and the voltage control oscillator 207. As described above, the second feed back clock signal $FCS_2$ has a relative higher frequency than the first feed back clock signal $FCS_1$ and is transmitted to the second loop 203. Also, the first feed back clock signal $FCS_1$ is generated by frequency dividing the second feed back clock signal $FCS_2$, thus the first feed back clock signal $FCS_1$ is with lower frequency.

Figure 4:
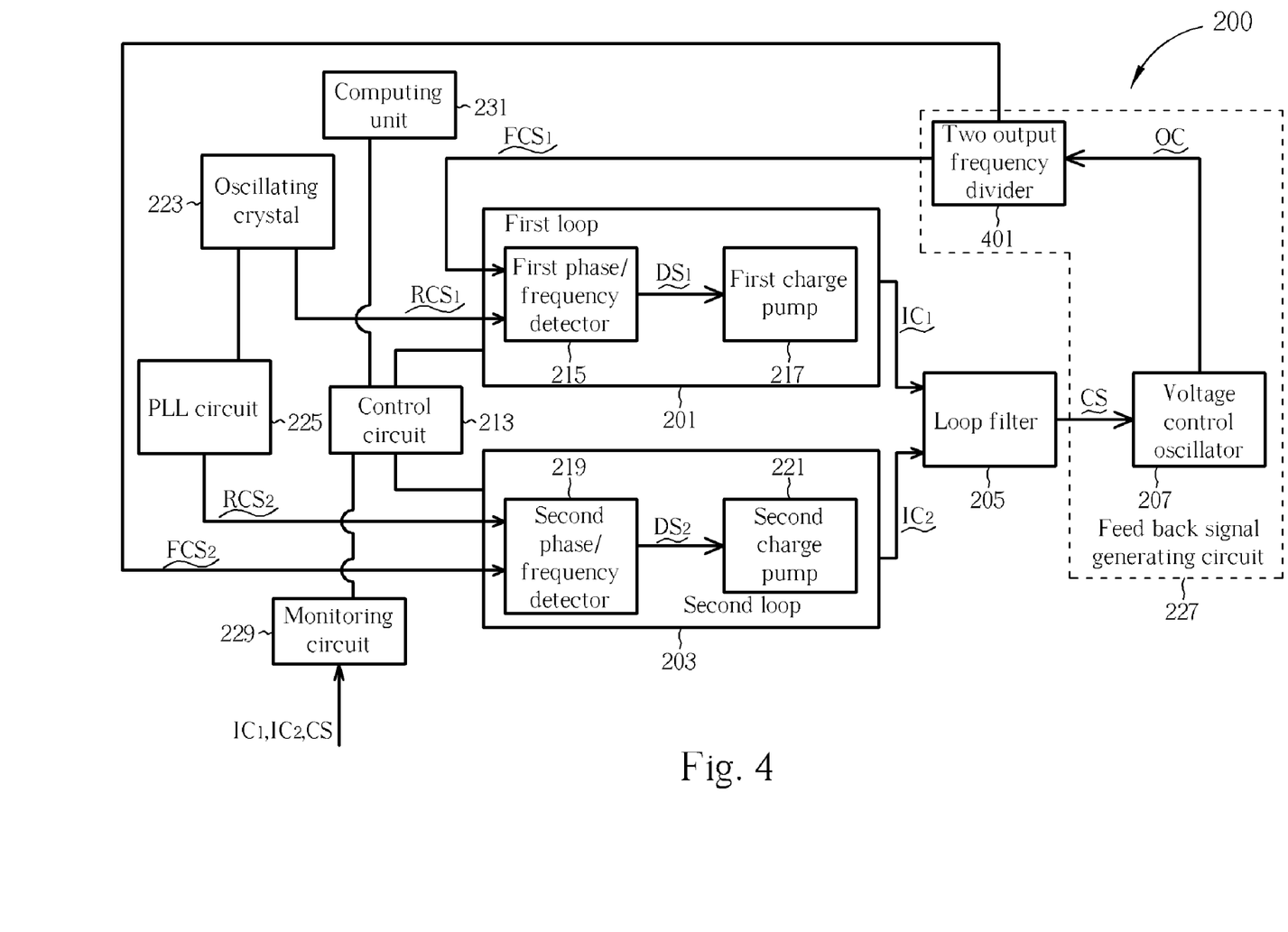
FIG. 4 illustrates a multi-loop PLL apparatus according to a third embodiment of the present invention.

In FIG. 4, the feed back signal generating module 227 includes a two output frequency-divider 401 and a voltage control oscillator 207. The two output frequency-divider 401 has different frequency dividing ratios, and can generate the second feed back clock signal $FCS_2$ with higher frequency and the first feed back clock signal $FCS_1$ with lower frequency according to the oscillating signal OS.

It should be noted that the above-mentioned embodiments are only examples and are not limitations of the present invention. Persons skilled in the art can amend the structure of the feed back signal generating module 227 to reach the same function, and such modifications also fall within the scope of the present invention.

Figure 5:
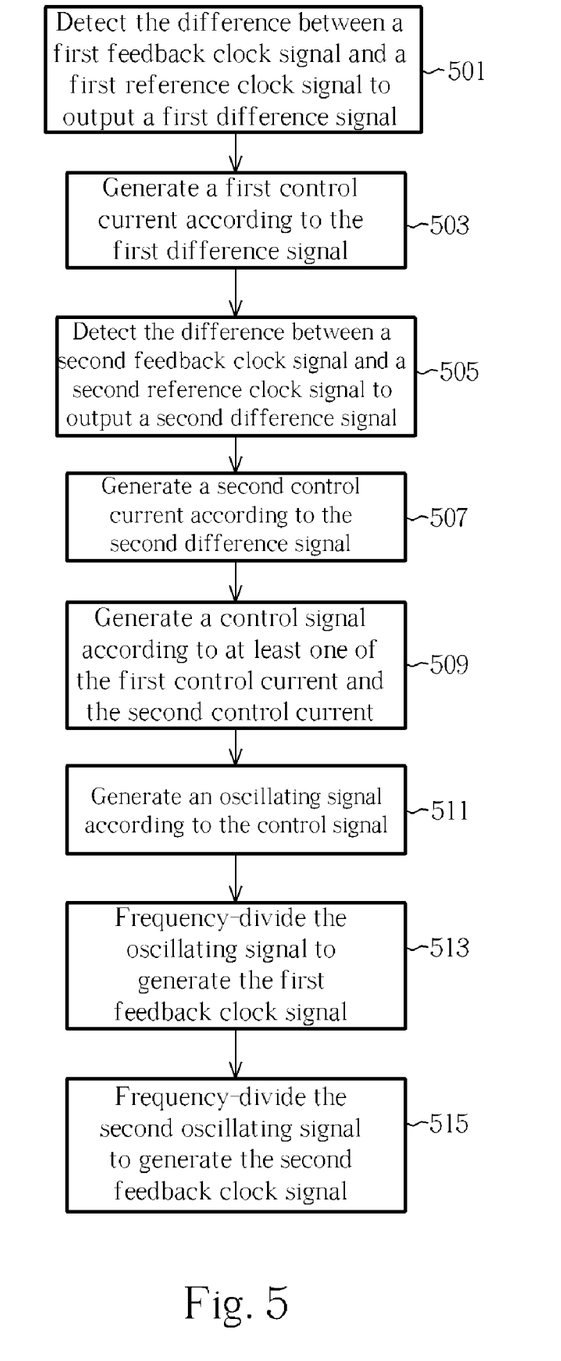
FIG. 5 illustrates a phase locked method corresponding to the multi-loop PLL apparatus shown in FIG. 2 to FIG. 4.

FIG. 5 illustrates a phase locked method corresponding to the multi-loop PLL apparatus shown in FIG. 2 to FIG. 4. As shown in FIG. 5, the method includes:

Step 501

Detect the difference between a first feedback clock signal $FCS_1$ and a first reference clock signal $RCS_1$ to output a first difference signal $DS_1$.

Step 503

Generate a first control current $IC_1$ according to the first difference signal $DS_1$.

Step 505

Detect the difference between a second feedback clock signal $FCS_2$ and a second reference clock signal $RCS_2$ to output a second difference signal $DS_2$.

Step 507

Generate a second control current $IC_2$ according to the second difference signal $DS_2$.

Step 509

Generate a control signal CS according to at least one of the first control current $IC_1$ and the second control current $IC_2$.

Step 511

Generate an oscillating signal OS according to the control signal CS.

Step 513

Frequency-divide the oscillating signal OS to generate the first feedback clock signal $FCS_1$.

Step 515

Frequency-divide the oscillating signal OS to generate the second feedback clock signal $FCS_2$.

In this case, the frequency of the second reference clock signal $RCS_2$ is higher than that of the first reference clock signal $RCS_1$. Also, the method utilizes the first reference clock signal $RCS_1$ to generate the next oscillating signal after the oscillating signal OS is locked to the second reference clock signal $RCS_2$.

Figure 6:
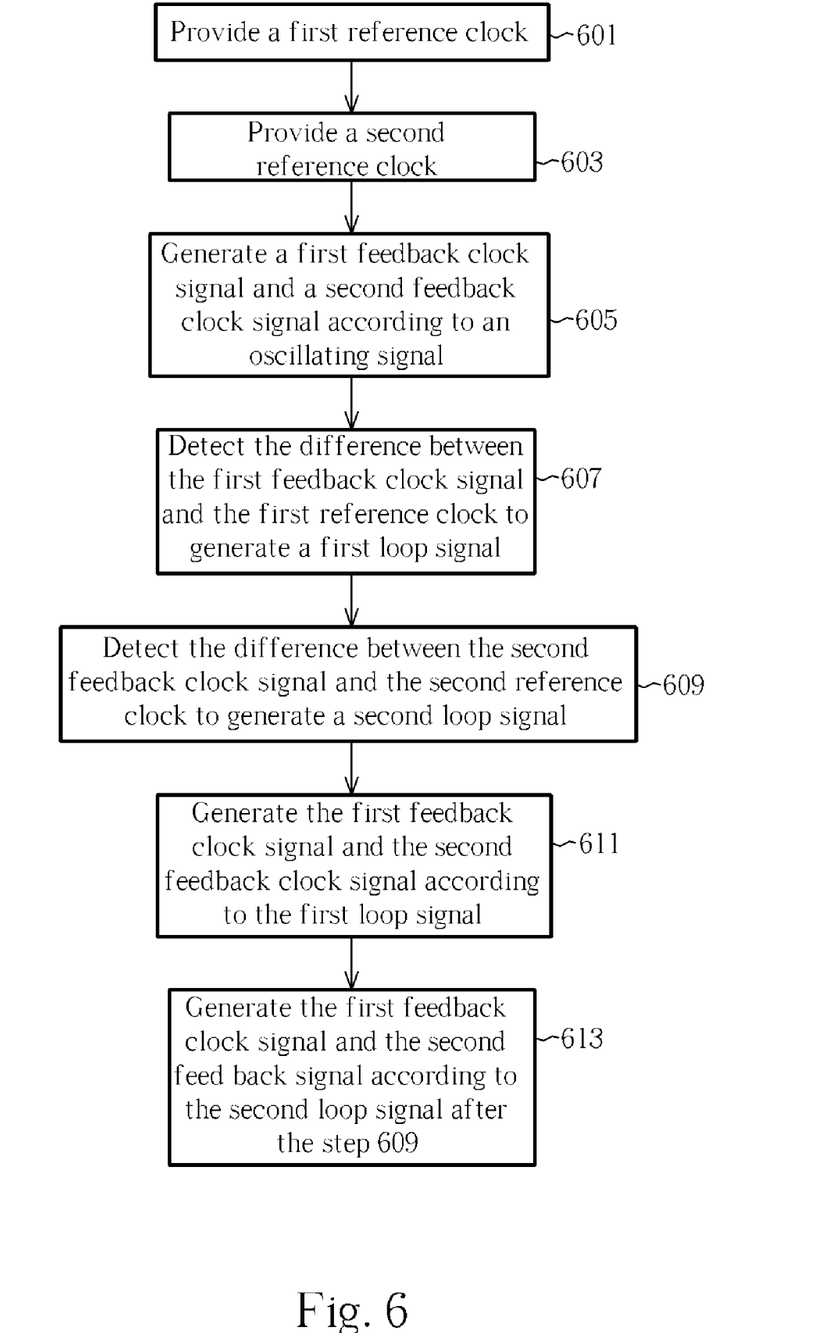
FIG. 6 illustrates another embodiment of a phase locked method corresponding to the multi-loop PLL apparatus shown in FIG. 2 to FIG. 4.

FIG. 6 illustrates another embodiment of a phase locked method corresponding to the multi-loop PLL apparatus shown in FIG. 2 to FIG. 4. The method includes:

Step 601

Provide a first reference clock.

Step 603

Provide a second reference clock.

Step 605

Generate a first feedback clock signal and a second feedback clock signal according to an oscillating signal.

Step 607

Detect the difference between the first feedback clock signal and the first reference clock to generate a first loop signal.

Step 609

Detect the difference between the second feedback clock signal and the second reference clock to generate a second loop signal.

Step 611

Generate the first feedback clock signal and the second feedback clock signal according to the first loop signal.

Step 613

Generate the first feedback clock signal and the second feed back clock signal according to the second loop signal after the step 609.

In this case, the frequency of the second reference clock signal $RCS_2$ is higher than that of the first reference clock signal $RCS_1$. Since other detailed characteristics are described in above-mentioned embodiments, they are omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-loop phase locked loop apparatus, comprising:
   a first loop, comprising:
      a first phase/frequency detector, for detecting a difference between a first feedback clock signal and a first reference clock signal to output a first difference signal; and
      a first charge pump, coupled to the first phase/frequency detector, for generating a first control current according to the first difference signal;
   a second loop, comprising:
      a second phase/frequency detector, for detecting a difference between a second feedback clock signal and a second reference clock signal to output a second difference signal; and
      a second charge pump, coupled to the second phase/frequency detector, for generating a second control current according to the second difference signal;
   a loop filter, coupled to the first charge pump and the second charge pump, for generating a control signal;
   a voltage control oscillator, coupled to the loop filter, for generating an oscillating signal according to the control signal;
   a first frequency divider, coupled to the voltage control oscillator and the first phase/frequency detector, for frequency-dividing the oscillating signal to generate the first feedback clock signal;
   a second frequency divider, coupled to the voltage control oscillator and the second phase/frequency detector, for frequency-dividing the oscillating signal to generate the second feedback clock signal;
   a control circuit, coupled to the first loop and the second loop, for switching between the first loop and the second loop to generate the control signal according to at least one of the first control current, the second control current and the control signal; and a computing unit, for computing a time parameter, wherein the control circuit switches the original used loop to the other loop if the time parameter reaches a predetermined value.

2. The multi-loop phase locked loop apparatus of claim 1, wherein the frequency of the second reference clock signal is higher than that of the first reference clock signal.

3. The multi-loop phase locked loop apparatus of claim 2, wherein the control circuit turns off the second loop and turns on the first loop after the multi-loop phase locked loop apparatus is locked to the second reference clock signal.

4. The multi-loop phase locked loop apparatus of claim 1, wherein the frequency of the second reference clock signal is at least triple that of the first reference clock signal.

5. The multi-loop phase locked loop apparatus of claim 1, wherein the second reference clock signal is generated by a PLL circuit according to the first reference clock signal.

6. The multi-loop phase locked loop apparatus of claim 1, further comprising a third loop, wherein the third loop comprises: a third phase/frequency detector, for detecting the difference between a third feedback clock signal and a third reference clock signal to output a third difference signal; and a third charge pump, coupled to the third phase/frequency detector, for generating a third control current according to the third difference signal.

7. The multi-loop phase locked loop apparatus of claim 1, further comprising a monitoring circuit, for monitoring the value of the first control current and the second control current or, wherein if the control signal is stable, the control circuit switches the first loop or the second loop.

8. A phase locking method, comprising:
   detecting a difference between a first feedback clock signal and a first reference clock signal to output a first difference signal;
   generating a first control current according to the first difference signal;
   detecting a difference between a second feedback clock signal and a second reference clock signal to output a second difference signal;
   generating a second control current according to the second difference signal;
   generating a control signal according to at least one of the first control current and the second control current;
   generating a first oscillating signal according to the control signal; and
   utilizing the first reference clock signal to generate a second oscillating signal after the first oscillating signal is locked to the second reference clock signal.

9. The phase locking method of claim 8, further comprising:
   frequency-dividing the first oscillating signal to generate the first feedback clock signal; and
   frequency-dividing the second oscillating signal to generate the second feedback clock signal.

10. The phase locking method of claim 9, wherein the frequency of the second reference clock signal is higher than that of the first reference clock signal.

11. The phase locking method of claim 8, wherein the frequency of the second reference clock signal is at least triple that of the first reference clock signal.

12. The phase locking method of claim 8, wherein the second reference clock signal is generated by a PLL circuit according to the first reference clock signal.

13. The phase locking method of claim 8, wherein the first reference clock signal is generated by an oscillating crystal.

14. The phase locking method of claim 8, further comprising:
   detecting the difference between a third feedback clock signal and a third reference clock signal to output a third difference signal;
   generating a third control current according to the third difference signal; and
   generating the control signal according to al least one of the first control current, the second control current, and the third control current.

15. A multi-loop phase locked loop apparatus, comprising:
   a feedback clock signal generating module, for generating a first feedback clock signal and a second feedback clock signal;
   a first loop, for detecting the difference between the first feedback clock signal and a first reference clock to generate a first loop signal;
   a second loop, for detecting the difference between the second feedback clock signal and a second reference clock to generate a second loop signal; and
   a control unit, for choosing one of the first loop signal and the second loop signal to be the feedback clock signal, wherein the feedback clock signal generating module generates the first feedback clock signal and the second a computing unit, for computing a time parameter, wherein the control unit switches the original used loop to the other loop if the time parameter reaches a predetermined value.

16. The multi-loop phase locked loop apparatus of claim 15, further comprising a loop filter, coupled between the first loop and the feedback clock signal generating module and coupled between the second loop and the feedback clock signal generating module.

17. The multi-loop phase locked loop apparatus of claim 15, wherein the first loop comprises a first phase/frequency detector and a first charge pump, and the second loop comprises a second phase/frequency detector and a second charge pump.

18. The multi-loop phase locked loop apparatus of claim 15, wherein the feedback clock signal generating module comprises:
   a voltage control oscillator, for generating a first oscillating signal and a second oscillating signal;
   a first frequency divider, coupled to the voltage control oscillator and the first loop, for generating the first feedback clock signal according to the first oscillating signal; and
   a second frequency divider, coupled to the voltage control oscillator and the second loop, for generating the second feedback clock signal according to the second oscillating signal.

19. The multi-loop phase locked loop apparatus of claim 15, wherein the feedback clock signal generating module comprises:
   a voltage control oscillator, for generating an oscillating signal;
   a first frequency divider, coupled to the first loop, for generating the first feedback clock signal according to the second feedback clock signal; and
   a second frequency divider, coupled to the first frequency divider, the voltage control oscillator and the second loop, for generating the second feedback clock signal according to the oscillating signal.

20. The multi-loop phase locked loop apparatus of claim 15, wherein the feedback clock signal generating module comprises:
- a voltage control oscillator, for generating a first oscillating signal and a second oscillating signal;
- a two output frequency divider, coupled to the voltage control oscillator, the first loop and the second loop, for generating the first feedback clock signal according to the first oscillating signal or generating the second feedback clock signal according to the first oscillating signal.

21. The multi-loop phase locked loop apparatus of claim 15, being included in a UWB (Ultra Wideband) apparatus.

22. The multi-loop phase locked loop apparatus of claim 15, wherein the control unit is a logic circuit.

23. The multi-loop phase locked loop apparatus of claim 15, wherein the control unit is an AND gate or a switch.

24. The multi-loop phase locked loop apparatus of claim 15, further comprising a monitoring circuit, for monitoring the value of a first control current and a second control current, or if a control signal is stable, the control unit switches the first or the second loop.

25. A multi-loop phase locked loop apparatus, comprising:
a first loop, comprising:
- a first phase/frequency detector, for detecting a difference between a first feedback clock signal and a first reference clock signal to output a first difference signal; and
- a first charge pump, coupled to the first phase/frequency detector, for generating a first control current according to the first difference signal;

a second loop, comprising:
- a second phase/frequency detector, for detecting a difference between a second feedback clock signal and a second reference clock signal to output a second difference signal; and
- a second charge pump, coupled to the second phase/frequency detector, for generating a second control current according to the second difference signal;

a loop filter, coupled to the first charge pump and the second charge pump, for generating a control signal;
a voltage control oscillator, coupled to the loop filter, for generating an oscillating signal according to the control signal;
a first frequency divider, coupled to the voltage control oscillator and the first phase/frequency detector, for frequency-dividing the oscillating signal to generate the first feedback clock signal;
a second frequency divider, coupled to the voltage control oscillator and the second phase/frequency detector, for frequency-dividing the oscillating signal to generate the second feedback clock signal; and
a control circuit, coupled to the first loop and the second loop, for switching between the first loop and the second loop to generate the control signal according to at least one of the first control current, the second control current and the control signal, wherein the control circuit turns off the second loop and turns on the first loop after the multi-loop phase locked loop apparatus is locked to the second reference clock signal.

26. A multi-loop phase locked loop apparatus, comprising:
a first loop, comprising:
- a first phase/frequency detector, for detecting a difference between a first feedback clock signal and a first reference clock signal to output a first difference signal; and
- a first charge pump, coupled to the first phase/frequency detector, for generating a first control current according to the first difference signal;

a second loop, comprising:
- a second phase/frequency detector, for detecting a difference between a second feedback clock signal and a second reference clock signal to output a second difference signal; and
- a second charge pump, coupled to the second phase/frequency detector, for generating a second control current according to the second difference signal;

a loop filter, coupled to the first charge pump and the second charge pump, for generating a control signal;
a voltage control oscillator, coupled to the loop filter, for generating an oscillating signal according to the control signal;
a first frequency divider, coupled to the voltage control oscillator and the first phase/frequency detector, for frequency-dividing the oscillating signal to generate the first feedback clock signal;
a second frequency divider, coupled to the voltage control oscillator and the second phase/frequency detector, for frequency-dividing the oscillating signal to generate the second feedback clock signal;
a control circuit, coupled to the first loop and the second loop, for switching between the first loop and the second loop to generate the control signal according to at least one of the first control current, the second control current and the control signal; and
a monitoring circuit, for monitoring the value of the first control current and the second control current or, wherein if the control signal is stable, the control circuit switches the first loop or the second loop.

27. A multi-loop phase locked loop apparatus, comprising:
a feedback clock signal generating module, for generating a first feedback clock signal and a second feedback clock signal;
a first loop, for detecting the difference between the first feedback clock signal and a first reference clock to generate a first loop signal;
a second loop, for detecting the difference between the second feedback clock signal and a second reference clock to generate a second loop signal; and
a control unit, for choosing one of the first loop signal and the second loop signal to be the feedback clock signal, wherein the feedback clock signal generating module generates the first feedback clock signal and the second
a computing unit, for computing a time parameter, wherein the control unit switches the original used loop to the other loop if the time parameter reaches a predetermined value;
a monitoring circuit, for monitoring the value of a first control current and a second control current, or if a control signal is stable, the control unit switches the first or the second loop.

* * * * *